(12) United States Patent
Gao et al.

(10) Patent No.: US 6,818,918 B2
(45) Date of Patent: Nov. 16, 2004

(54) JOSEPHSON JUNCTIONS WITH A CONTINUALLY GRADED BARRIER

(75) Inventors: Ju Gao, Hong Kong (HK); Jinglan Sun, Hong Kong (HK)

(73) Assignee: The University of Hong Kong, Hong Kong (HK)

( * ) Notice: Subject to any disclaimer, the term of this patent is extended or adjusted under 35 U.S.C. 154(b) by 0 days.

(21) Appl. No.: 10/008,022

(22) Filed: Nov. 5, 2001

(65) Prior Publication Data

US 2002/0096429 A1 Jul. 25, 2002

Related U.S. Application Data

(60) Provisional application No. 60/246,172, filed on Nov. 6, 2000.

(51) Int. Cl.[7] .............................................. H01L 39/22
(52) U.S. Cl. ......................................... 257/35; 257/31
(58) Field of Search ..................................... 257/31, 35

(56) References Cited

U.S. PATENT DOCUMENTS

| | | |
|---|---|---|
| 4,424,101 A | 1/1984 | Nowicki |
| 4,485,000 A | 11/1984 | Kawaguchi et al. |
| 4,834,855 A | 5/1989 | Bloomquist et al. |
| 5,066,381 A | 11/1991 | Ohta et al. |
| 5,215,639 A | 6/1993 | Boys |
| 5,262,032 A | 11/1993 | Hartig et al. |
| 5,372,694 A | 12/1994 | Szczyrbowski |
| 5,591,314 A | 1/1997 | Morgan et al. |
| 6,143,149 A | 11/2000 | Abe |

OTHER PUBLICATIONS

Program and Abstracts of the Second International Conference on New Theories, Discoveries, and Applications of Superconductors and Related Materials (New3SC–2, May 31–Jun. 4, 1999 Circus Circus, Las Vegas, Nevada, USA, p. 5, SESSION W3B1505: J. Gao, "The Transport Behavior Near the Junction Interface in Multilayer Josephson Junctions with a Graded Barrier".*

Boguslavskij, Yu. M., et al., "Transport Processes and Reduction of $I_cR_n$ Product in $YBa_2Cu_3O_x$/$PrBa_2Cu_3O_x$/$YBa_2Cu_3O_x$ Ramp–Type Josephson Junctions," IEEE Transactions on Applied Superconductivity, vol. 3, No. 1, pp. 2034–2037, Mar. 1993.

Char, K., "High Tc Superconductor–Normal–Superconductor Josephson Junctions Using $CaRuO_3$ as the Metallic Barrier," Appl. Phys. Lett. 62 (2). pp. 196–198, Jan, 11, 1993.

Char, K., et al., "Study of Interface Resistances in Epitaxial $YBa_2Cu_3O_{7-x}$/Barrier$YBa_2Cu_3O_{7-x}$ Junctions," Appl. Phys. Lett. 63 (17), pp. 2420–2422. Oct. 25, 1993.

Chin, D. K., et al., "Novel All–High $T_c$ Epitaxial Josephson Junction," Appl. Phs. Lett. 58 (7), pp. 753–755, Feb. 18, 1991.

Dilorio, M. S., et al., "Practical High $T_c$ Josephson Junctions and dc SQUIDs Operating Above 85K," Appl. Phys. Lett. 58 (22), pp. 2552–2554, Jun. 3, 1991.

Faley , M. I., et al., "Josephson Junctions, Interconnects, and Crossovers on Chemically Etched Edges of $YBa_2Cu_3O_{7-x}$," Appl. Phys. Lett. 63(15), pp. 2138–2140, Oct. 11, 1993.

(List continued on next page.)

Primary Examiner—Bradley Baumeister
(74) Attorney, Agent, or Firm—Jones Day

(57) ABSTRACT

A Josephson junction includes first and second electrodes, each of which is formed of superconductive material. The first electrode has a first electrode face. A barrier of the junction extends from the first electrode to the second electrode. The barrier has a first barrier face opposing and adjoining the first electrode face. The barrier is formed of non-superconductive barrier material and superconductive barrier material. A concentration of the superconductive barrier material is greater than zero at the first barrier face, whereby the first barrier face is formed at least partially of the superconductive barrier material.

16 Claims, 2 Drawing Sheets

OTHER PUBLICATIONS

Gao, J., et al., "Controlled Preparation of All High–$T_c$ SNS–Type Edge Junctions and DC SQUIDs," Physica, C 171, pp. 126–130, 1990.

Gao, J., et al., "Formation of Outgrowths at the Initial Growing Stage of $YBa_2Cu_3O_x$ Ultrathin Films on $ZrO_2$ Substrate," Appl. Phys. Lett. 67 (15), pp. 2232–2234, Oct. 9, 1995.

Golubov, A. A., et al., "Josephson Effect in SNIS Tunnel Structures with Finite Transparency of the SN Boundaries," Sov. Phys. JETP 69 (4), pp. 805–812, Oct. 1989.

Hunt, B. D., et al., "All High Tc Edge–Geometry Weak Links Utilizing Y–Ba–cu–O Barrier Layers," Appl. Phys. Lett. 59 (8), pp. 982–984, Aug. 19, 1991.

Jia, Q. X. et al., "High–Temperature Superconductor Josephson Junctions with a Gradient Pr–doped $Y_{1-x}Pr_xBa_2Cu_3O_{7-\delta}$ (x=0.1, 0.3, 0.5) as Barriers," Appl. Phys. Lett. 65 (22), pp. 2866–2868, Nov. 28, 1994.

Koren, G., et al., "Properties of all $YBa_2Cu_3O_7$ Josephson Edge Junctions Prepared by in situ Laser Ablation Deposition," Appl. Phys. Lett. 58 (6), pp. 634–636, Feb. 11, 1991.

Kuprianov. M. Yu., et al., "Influence of Boundary Transparency on the Critical Current of "dirty" SS'S Structures," Sov. Phys. JETP 67 (6), pp. 1163–1168, Jun. 1988.

Likharev, K. K., "Superconducting Weak Links," Reviews of Modern Physics, vol. 51, No. 1, pp. 101–159, Jan. 1979.

Sun, J. L., et al., "Transport Characteristics of Ramp–Type $YBa_2Cu_3O_{7-\delta}/PrBa_2Cu_3O_{7-y}/YBa_2Cu_3O_{7-\delta}$ Josephson Junctions," Physical Review B, vol. 62, No. 2, pp. 1457–1463, Jul. 1, 2000.

Tang, W. H., et al., "High Resistivity of Tetragonal $Pr_{1+x}Ba_{2-x}Cu_3O_y$ Solid Solution," Physica C 315, pp. 66–70, 1999.

* cited by examiner

JOSEPHSON JUNCTIONS WITH A CONTINUALLY GRADED BARRIER

This application claims the benefit of U.S. Provisional Application No. 60/246,172, filed Nov. 6, 2000.

FIELD OF THE INVENTION

The present invention relates to Josephson junctions.

BACKGROUND

A Josephson junction has a barrier extending from one superconductive electrode to another superconductive electrode. Under certain conditions, electrons in one of the electrodes can tunnel through the barrier to the other electrode, in accordance with the Josephson effect.

SUMMARY

The present invention provides a novel barrier for making Josephson junctions. The Josephson junction comprises first and second electrodes, each of which is formed of superconductive material. The first electrode has a first electrode face. A barrier of the junction extends from the first electrode to the second electrode. The barrier has a first barrier face opposing and adjoining the first electrode face. The barrier is formed of non-superconductive barrier material and superconductive barrier material. A concentration of the superconductive barrier material is greater than zero at the first barrier face, whereby the first barrier face is formed at least partially of the superconductive barrier material.

In a preferred embodiment of the invention, the concentration of the superconductive barrier material is 100% at the first barrier face, whereby the first barrier face is formed entirely of the superconductive barrier material. The junction has a plurality of distinct contiguous portions extending sequentially from the first electrode to the second electrode. The concentration of the superconductive barrier material is uniform along one of the portions, and the portion is preferably free of the superconductive barrier material. The first and second electrodes are formed of the superconductive barrier material. The concentration of the superconductive barrier material declines away linearly from the first barrier face in a direction toward the second electrode. The superconductive barrier material has a chemical formula. The chemical formula includes Yttrium, and the declining away of the concentration is characterized by the spatially graduated replacement of the Yttrium in the chemical formula by Praseodymium.

Preferably, the second electrode has a second electrode face, and the barrier further has a second barrier face opposing and adjoining the second electrode face. The concentration of the superconductive barrier material is greater than zero at both barrier faces, whereby both barrier faces are formed at least partially of the superconductive barrier material. Preferably, the concentration of the superconductive barrier material is 100% at both barrier faces, whereby both barrier faces are formed entirely of the superconductive barrier material. The concentration of the superconductive barrier material declines away from the first barrier face in a direction toward the second barrier face and declines away from the second barrier face in a direction toward the first barrier face. The concentration of the superconductive barrier material varies symmetrically about a midpoint between the barrier faces.

The invention also provides a Josephson junction comprising non-superconductive material and superconductive material. The superconductive material is mixed with the non-superconductive material in a spatially varied concentration to yield a spatially varied critical temperature of the junction. The spatially varied critical temperature has minimum and maximum critical temperatures. When the junction is cooled to a temperature between the minimum and maximum critical temperatures, the junction will have two superconducting zones extending from opposite ends of a non-superconducting zone. The length of the superconducting zone and the lengths of the non-superconducting zones in total equals the total length of the junction. The junction will be responsive to a decrease in temperature by effecting an increase in lengths of said superconducting zones and a corresponding decrease in length of said non-superconducting zone.

The invention further provides an apparatus for a sputtering system having a composite target made of two materials. The sputtering system includes a radiation source and a substrate. The apparatus comprises a target body having a peripheral surface. A first portion of the peripheral surface is formed of a first material to be sputtered from the target and deposited onto the substrate in a first concentration. A second portion of the peripheral surface is formed of a second material to be sputtered from the target and deposited onto the substrate in a second concentration. The target body is configured to enable variation of the first concentration relative to the second concentration by variation of the orientation of the target body relative to the radiation source to thereby vary the areas of the respective surface portions facing the radiation source.

In a preferred embodiment, the variation of the orientation of the target body is through rotation of the target body. The target body is cylindrical, and the first and second portions are disposed on radially-opposite sides of the cylindrical target.

DESCRIPTION OF THE INVENTION

Figure 1:
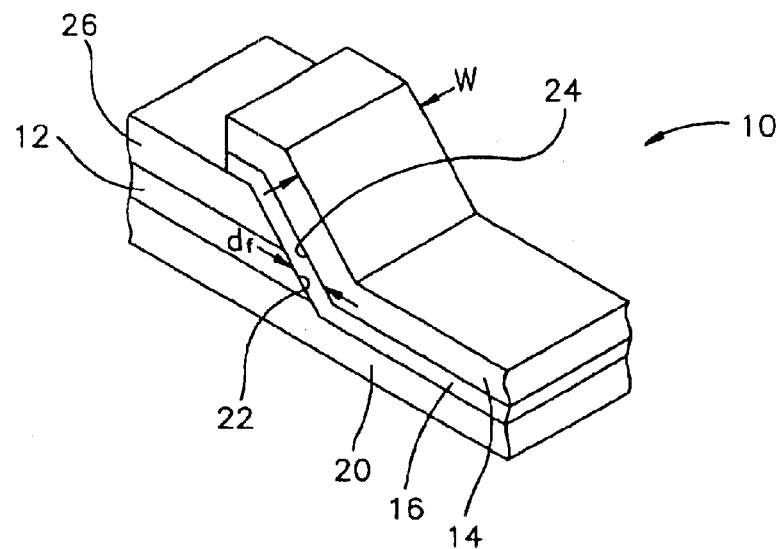
FIG. 1 is a sectional view of a Josephson junction according to the present invention.

The apparatus 10 shown in FIG. 1 has parts which, as described below, are examples of the elements recited in the claims.

The apparatus 10 is a Josephson junction 10. The junction 10 includes first and second superconductive electrodes 12 and 14. The electrodes 12 and 14 are separated by a barrier 16 that extends from the first electrode 12 to the second electrode 14. The electrodes 12 and 14 are "superconductive" in that they become superconducting when cooled to below a critical temperature. To be "superconducting" is to conduct electricity without resistance. When the electrodes 12 and 14 are superconducting, electrons in the first electrode 12 can tunnel without resistance through the barrier 16 to the second electrode 14 if the length $d_f$ of the barrier is sufficiently low. In such a case, the entire junction 10 becomes superconducting, as though the superconducting electrodes 12 and 14 were adjoined directly together without the barrier 16 in-between. This phenomenon is called the Josephson effect.

When exposed to a sufficiently strong magnetic field, the junction 10 loses its superconducting character. The junction 10 can thus serve as an electrical switch by switching off the resistance-less flow of electrons in response to a magnetic field. The sensitivity of the junction 10 in switching off current in response to the magnetic field is related to the barrier length $d_f$.

In this example, the junction 10 is ramp-type. The junction 10 is deposited onto a substrate 20 formed of $SrTiO_3$. An insulator 26 is formed over the first electrode 12.

Figure 2:
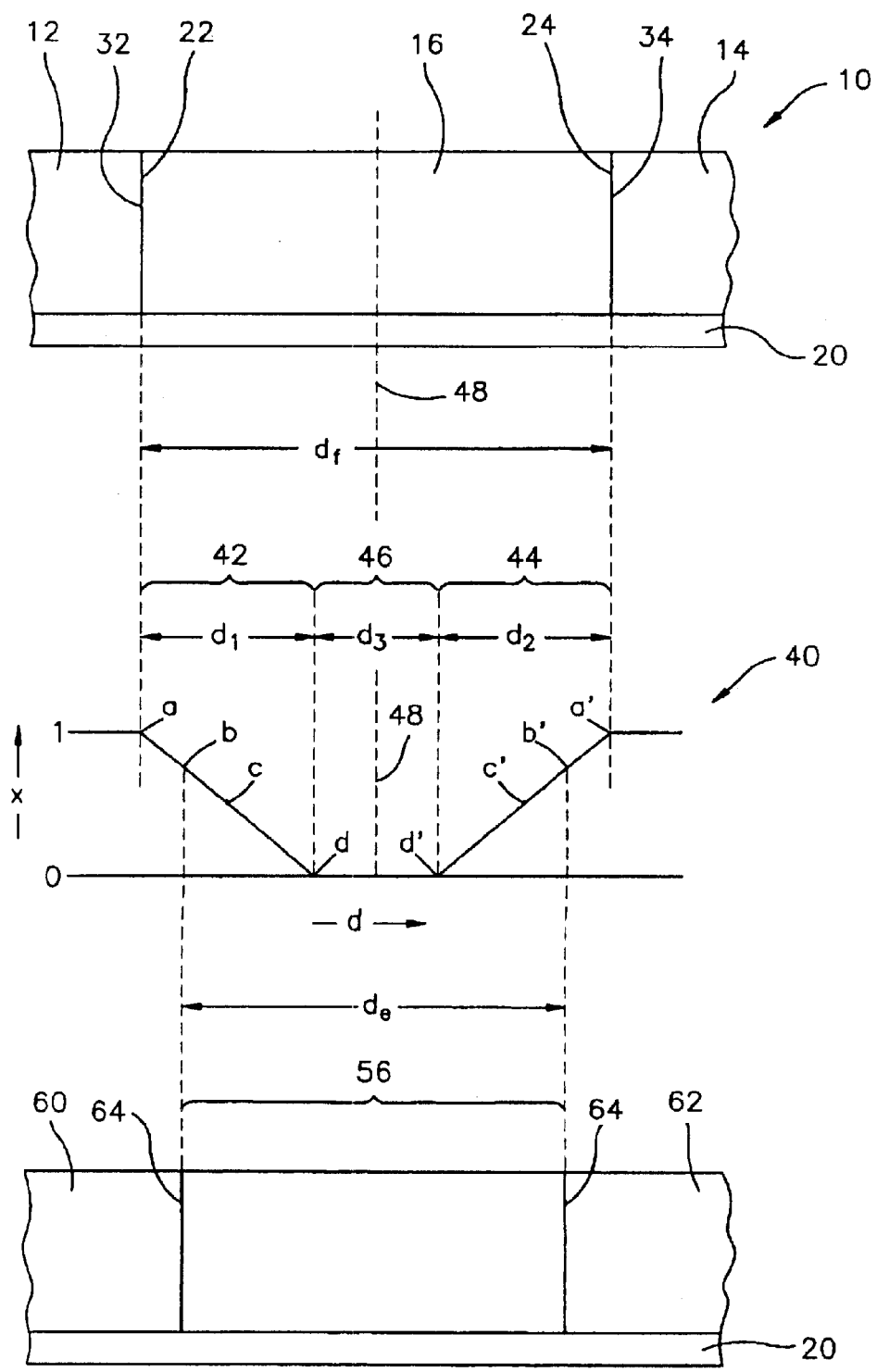
FIG. 2 is a schematic view of the junction of FIG. 1.

FIG. 2 includes a schematic view of the junction 10, showing the electrodes 12 and 14 and the barrier 16. Each of the first and second electrodes 12 and 14 is formed of superconductive material. In this embodiment, both electrodes 12 and 14 are formed of the same superconductive material. The material has a chemical formula of $YBa_2Cu_3O_{7-\delta}$, which can be represented as $Y_xPr_{1-x}Ba_2Cu_3O_{7-\delta}$ where x=1. The first electrode 12 has a first electrode face and the second electrode 14 has an opposing second electrode face 24.

A first face 32 of the barrier 16 opposes and adjoins the first electrode face 22. Similarly, a second face 34 of the barrier 16 opposes and adjoins the second electrode face 24. The barrier 16 is a composition formed of both the superconductive material and a non-superconductive barrier material. The non-superconductive barrier material has the chemical formula $PrBa_2Cu_3O_{7-\delta}$, which corresponds to $Y_xPr_{1-x}Ba_2Cu_3O_{7-\delta}$ where x=0.

The parameter x in the formula $Y_xPr_{1-x}Ba_2CU_3O_{7-\delta}$ represents the concentration of the superconductive material within the composition of superconductive and non-superconductive materials. The concentration of the superconductive material is spatially varied within the barrier 16. This spatial variation is defined by a concentration gradient that extends horizontally, as viewed in the drawings, from the first barrier face 32 to the second barrier face 34.

In FIG. 2, the gradient is represented by a graph 40 of x vs. d, where d represents the distance from the first barrier face 32, as measured in a horizontal direction from the first barrier face 32 toward the second barrier face 34. The gradient 40 extends from the first barrier face 32 to the second barrier face 34 and is manifested by the graduated replacement of Yttrium, Y, by praseodymium, Pr, in the formula $Y_xPr_{1-x}Ba_2Cu_3O_{7-\delta}$. A concentration of the superconductive material greater than zero is present at both barrier faces 32 and 34. In this example, both barrier faces 32 and 34 are formed entirely of the superconductive material. This corresponds to a concentration of 100%, represented by x=1.

The gradient 40 in this example has three distinct regions. Specifically, first and second transition regions 42 and 44 extend from opposite sides of a central region 46. The first, second and central regions 42, 44 and 46 have finite lengths, $d_1$, $d_2$ and $d_3$, respectively.

In both transition regions 42 and 44, the concentration of the superconductive material declines away from the adjacent barrier face 32 and 34 toward the opposite barrier face 32 and 34. The declination is smooth and linear, reaching a minimum at the central region 46.

In general, a superconductive material superconducts only when it is cooled to a temperature at or below a critical temperature $T_c$. The critical temperature $T_c$ is characteristic of the particular chemical formula of that material. The critical temperature $T_c$ of this particular barrier 16 is spatially varied through the barrier 16, because the concentration of the superconductive material is spatially varied through the barrier 16.

Specifically, the concentration of the superconductive material, represented by the parameter x of $Y_xPr_{1-x}Ba_2CU_3O_{7-\delta}$, declines smoothly from a value of 1 at points a and a' on the gradient 40 to a value of 0 at points d and d'. $T_c$ is about 90° K. at x=1 and decreases with decreasing x. In other words, $T_c$ is about 90° K. for a 100% concentration of the superconductive material, $YBa_2Cu_3O_{7\delta}$, and decreases with decreasing concentration of the superconductive material. Therefore, $T_c$ is about 90° K. at points a and a'. $T_c$ is lower at points b and b' than at points a and a'. From points b and b', $T_c$ decreases further to a temperature of absolute zero (0° K.) at points c and c', which correspond to a value of x of about 0.5. A temperature below absolute zero cannot exist. Therefore, $T_c$ remains at absolute zero at all points between points c and d and between points c' and d'. Since absolute zero cannot be achieved, all points between c and d and also all points between c' and d' in practice cannot become superconducting.

In the central region 46, the concentration of the superconductive material is uniform. In this example, the concentration equals zero. Due to the absence of superconductive material in the central region 46, the central region 46 cannot superconduct at any temperature.

Throughout the barrier 16, the gradient 40 is symmetric about a plane 48 that is centrally located between and parallel to the barrier faces 32 and 34. The gradient 40 is also free of a discontinuity in the x value. The barrier 16 has a minimum critical temperature of 0° K., existing at and between points c and c', and a maximum critical temperature of 90° K., existing at points a and a'.

The following is an example of how the junction 10 functions. The junction 10 is cooled to the maximum critical temperature, which is 90° K. This temperature is equal to $T_c$ of a 100% concentration of the superconductive material. As noted above, the junction 10 becomes superconducting at each point along the junction 10 at which the temperature is equal to or less than $T_c$ at that point. Hence, the electrodes 12 and 14 become superconducting, as do the barrier faces 32 and 34, where the concentration of the superconductive material is 100%. However, along the fall length $d_f$ of the barrier 16 between the barrier faces 32 and 34 where the concentration of superconductive material is less than 100%, the barrier 16 remains non-superconducting at this temperature.

Next, in this example, the junction 10 is cooled further to a temperature equal to $T_c$ of the material at point b. This temperature is between the minimum and maximum critical temperatures of the barrier 16. As stated above, the junction 10 becomes superconducting at each point along the junction 10 for which the temperature is equal to or less than $T_c$ at that point. Hence, the electrodes 12 and 14 superconduct, as do all points along the barrier 16 between points a and b and between points a' and b'. The barrier 16 remains non-superconducting along a length $d_e$ between points b and b', which is less than the full barrier length $d_f$. The length over which the barrier 16 is non-superconducting has thus been shortened by cooling the junction 10 to the lower temperature.

If the junction 10 is cooled still further to a yet lower temperature, the barrier 16 becomes non-superconducting along a still smaller length. Conversely, if the junction 16 is warmed, the barrier 16 becomes non-superconducting over a greater length. Therefore, at a temperature between the minimum and maximum temperatures, 0° K. and 90° K., the junction 10 comprises first and second superconducting zones 60 an 62 extending from opposite ends 64 and 66 of a non-superconducting zone 56. The non-superconducting zone 56 has a length $d_e$ that can be changed by changing the temperature. More specifically, the length of the non-superconducting zone 56 can be reduced by reducing the temperature and can be increased by increasing the temperature.

However, the length of the non-superconducting zone 56 can never become shorter than the distance between points c and c'. This is because each point between points c and c' lacks superconductive material in sufficient concentration to become superconducting, as noted above.

Figure 3:
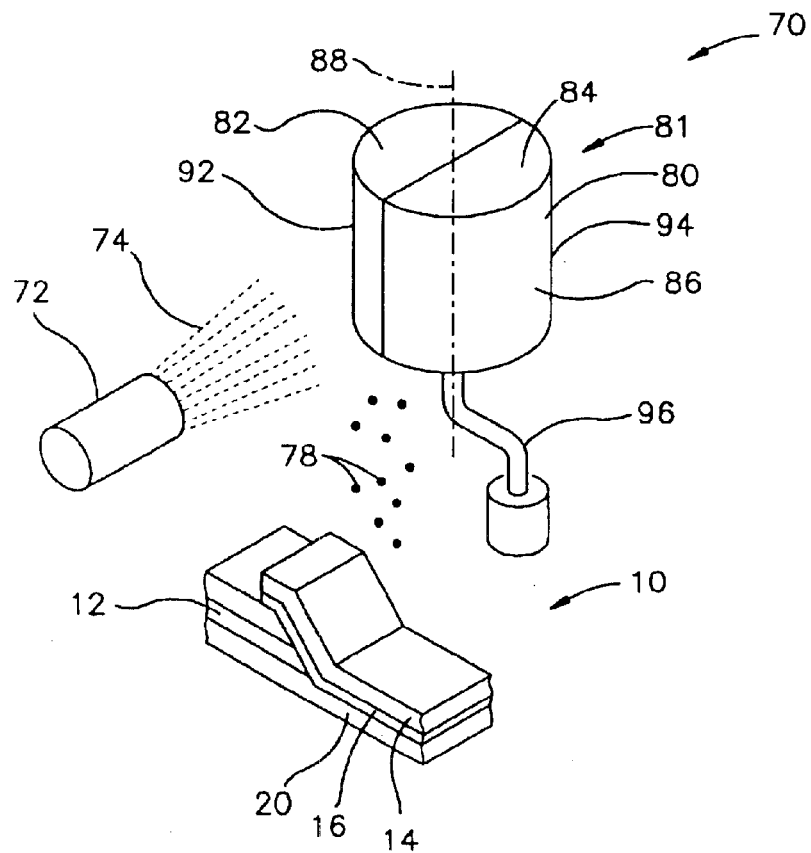
FIG. 3 is a schematic view of a sputtering system used in making the junction.

The Josephson junction 10 described above can be made through use of a sputtering system. A suitable sputtering system 70 is shown schematically in FIG. 3. The sputtering system 70 has a source 72 of radiation 74, such as ions, used to sputter target material 78 from the body 80 of a target 81. The target material 78 is deposited onto the substrate 20 to form the electrodes 12 and 14 and the barrier 16.

The target body 80 is formed of first and second target sections 82 and 84 adjoined together to define a cylindrical peripheral surface 86 centered on an axis 88. The first target section 82 is formed of a first material to be sputtered from the target body 80 and deposited onto the substrate 20 in a first concentration. In this example, the first material is $YBa_2Cu_3O_{7-\delta}$. The second target section 84 is formed of a second material to be sputtered from the target body 80 and deposited onto the substrate 20 in a second concentration. In this example, the second material is $PrBa_2Cu_3O_{7-\delta}$. The first concentration thus corresponds to the parameter x of $Y_xPr_{1-x}Ba_2Cu_3O_{7-\delta}$ as described above.

The peripheral surface 86 thus has a first surface portion 92 formed of the first material and a radially oppositely facing second surface portion 94 formed of the second material. An operator can rotate the target body 80 about its axis 88, thereby varying the orientation of the target body 80 relative to the radiation source 72. This rotation can be achieved through use of any suitable rotator 96, such as an electrically-driven motor or a manually-driven mechanism.

In operation, the first concentration relative to the second concentration, and hence the parameter x, can be controlled by controlling the orientation of the target body 80 relative to the ion source 72. For example, if the target body 80 is oriented such that only the first surface portion 92 faces the ion source 72, only the first material will be sputtered and deposited onto the substrate 20. Similarly, if only the second portion 94 faces the ion source 72, only the second material will be deposited onto the substrate 20. If both the first and second portions 92 and 94 partially face the ion source 72, both materials will be deposited. The relative concentrations of these two materials that will be deposited is related to the relative areas of the respective surface portions 92 and 94 facing the ion source 72.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A Josephson junction comprising:
   non-superconductive material; and
   superconductive material mixed with said non-superconductive material in a smoothly spatially varied concentration to yield a spatially varied critical temperature of said junction, said spatially varied critical temperature having minimum and maximum critical temperatures, such that, when said junction is cooled to a temperature between said minimum and maximum critical temperatures, said junction will have two superconducting zones extending from opposite ends of a non-superconducting zone such that the length of the superconducting zone and the lengths of the non-superconducting zones in total equal the total length of the junction, and said junction will be responsive to a decrease in temperature by effecting an increase in lengths of said superconducting zones and a corresponding decrease in length of said non-superconducting zone.

2. A Josephson junction as defined in claim 1 wherein said superconductive material has a chemical formula that includes Yttrium, and said spatially varied concentration is characterized by the spatially graduated replacement of said Yttrium in said chemical formula by Praseodymium.

3. A Josephson junction comprising:
   first and second electrodes, each formed of superconductive material; and
   a barrier extending from the first electrode to the second electrode, formed of superconductive barrier material and non-superconductive barrier material, and having a concentration of the superconductive barrier material that smoothly declines away from a first level at a first location in the barrier to a second level at a second location in the barrier, the second location being located between the first location and the second electrode.

4. The Josephson junction of claim 3 wherein the first location is at the first electrode, such that the concentration smoothly declines away from the first electrode toward the second electrode.

5. The Josephson junction of claim 4 wherein the concentration smoothly declines away also from the second electrode toward the first electrode.

6. The Josephson junction claim 3 wherein the concentration, from the first electrode to the second electrode, varies symmetrically about a plane that is centrally located between the electrodes.

7. The Josephson junction of claim 3 wherein the first level is 100%.

8. The Josephson junction of claim 3 wherein the second level is at or below a level at which the critical temperature is absolute zero.

9. The Josephson junction of claim 3 wherein the second level is 0%.

10. The Josephson junction of claim 3 wherein the concentration declines away linearly from the first level at the first location to the second level at the second location.

11. The Josephson junction of claim 3 wherein variation of the concentration is defined by a concentration gradient that is free of any discontinuity from the first electrode to the second electrode.

12. The Josephson junction of claim 3 wherein the first and second electrodes are formed of the superconductive barrier material.

13. The Josephson junction of claim 3 wherein the superconductive barrier material has a chemical formula, and the declining away of the concentration is characterized by a spatially graduated replacement of one element in the chemical formula by another element.

14. The Josephson junction of claim 3 made by a process using an apparatus having a first target surface formed of the superconductive barrier material, a second target surface formed of the non-superconductive barrier material and a radiation source, the process entailing smoothly varying orientations of the target surfaces relative to the radiation source to thereby smoothly vary the areas of the respective surfaces facing the radiation source, to achieve the smooth decline of the concentration of the superconductive barrier material deposited in the barrier.

15. The Josephson junction of claim 14 the second level is 0%.

16. A Josephson junction comprising:

first and second electrodes, each formed of superconductive material; and a barrier extending from the first electrode to the second electrode, formed of superconductive barrier material and non-superconductive barrier material, and having a concentration of the superconductive barrier material that declines away from a first level at the first electrode to a second level at a location, in the barrier, between the first electrode and the second electrode, the second level being below a concentration level at which the critical temperature is absolute zero.

* * * * *

UNITED STATES PATENT AND TRADEMARK OFFICE
CERTIFICATE OF CORRECTION

PATENT NO. : 6,818,918 B2
DATED : November 16, 2004
INVENTOR(S) : Gao et al.

It is certified that error appears in the above-identified patent and that said Letters Patent is hereby corrected as shown below:

Column 6,
Line 61, delete "baffler" and insert -- barrier --.
Lines 63 and 64, delete "clement" and insert -- element --.

Column 7,
Line 1, after "material" insert -- , --.
Line 8, after "14" insert -- wherein --.

Signed and Sealed this

Fifth Day of April, 2005

JON W. DUDAS
*Director of the United States Patent and Trademark Office*